United States Patent
Song et al.

(10) Patent No.: US 11,036,362 B2
(45) Date of Patent: *Jun. 15, 2021

(54) GRAPHIC FLOW HAVING UNLIMITED NUMBER OF CONNECTIONS BETWEEN SHAPES

(71) Applicant: Microsoft Technology Licensing, LLC, Redmond, WA (US)

(72) Inventors: Ping Song, Shanghai (CN); Chao Tian, Shanghai (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 9 days.

This patent is subject to a terminal disclaimer.

(21) Appl. No.: 16/579,658

(22) Filed: Sep. 23, 2019

(65) Prior Publication Data

US 2020/0034010 A1 Jan. 30, 2020

Related U.S. Application Data

(63) Continuation of application No. 15/179,027, filed on Jun. 10, 2016, now Pat. No. 10,423,302, which is a
(Continued)

(51) Int. Cl.
*G06F 3/0481* (2013.01)
*G06F 3/0482* (2013.01)
(Continued)

(52) U.S. Cl.
CPC ........ *G06F 3/0482* (2013.01); *G06F 3/04812* (2013.01); *G06F 3/04842* (2013.01); *G06F 30/18* (2020.01); *G06F 30/00* (2020.01)

(58) Field of Classification Search
CPC .... G06F 3/0482; G06F 30/18; G06F 3/04842; G06F 3/04812; G06F 3/00; G06F 30/00
See application file for complete search history.

(56) References Cited

U.S. PATENT DOCUMENTS

| | | | | |
|---|---|---|---|---|
| 5,862,379 A | * | 1/1999 | Rubin | G06F 8/34 717/109 |
| 2010/0295871 A1 | * | 11/2010 | Dua | G06T 1/00 345/660 |
| 2012/0081389 A1 | * | 4/2012 | Dilts | G06F 3/04812 345/619 |

OTHER PUBLICATIONS

Jock D. Mackinlay et al., Show Me: Automatic Presentation for Visual Analysis, Nov. 1, 2007, IEEE Transactions on Visualization and Computer Graphics, vol. 13, No. 6, pp. 1137-1144 (Year: 2007).*

(Continued)

*Primary Examiner* — Tam T Tran

(74) *Attorney, Agent, or Firm* — Wade IP Law PLLC

(57) ABSTRACT

Techniques are described herein that are capable of generating a graphic flow having an unlimited number of connections between shapes. The shapes are provided in a visual representation of a workspace defined by pixels. For instance, a first shape may have an outer perimeter defined by a first subset of the pixels; a second shape may have an outer boundary defined by a second subset of the pixels, and so on. Any pixel in each subset may serve as a connection point. For example, a first pixel of the first subset may serve as a first connection point based on any of a variety of first criteria, and a second pixel of the second subset may serve as a second connection point based on any of a variety of second criteria. In accordance with this example, a connection may be provided between the first and second connection points.

20 Claims, 9 Drawing Sheets

Related U.S. Application Data continuation of application No. 13/307,720, filed on Nov. 30, 2011, now Pat. No. 9,367,201.

(51) Int. Cl.
*G06F 30/18* (2020.01)
*G06F 3/0484* (2013.01)
*G06F 30/00* (2020.01)

(56) References Cited

OTHER PUBLICATIONS

Toshio Tonouchi et al., Creating Visual Objects by Direct Manipulation, Jan. 1, 1992, IEEE Xplore, pp. 95-101 (Year: 1992).*

* cited by examiner

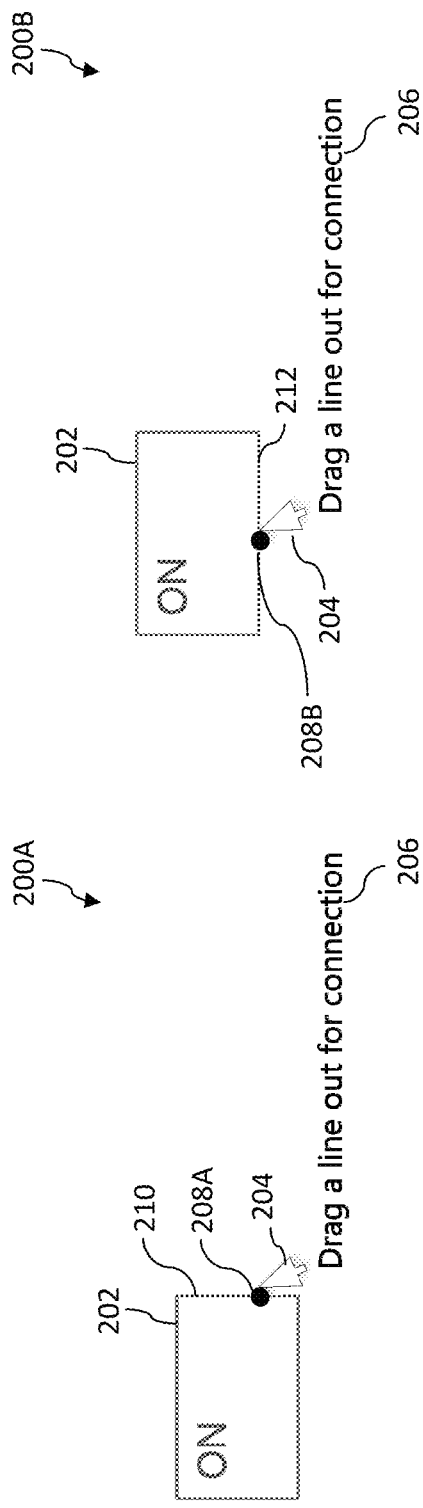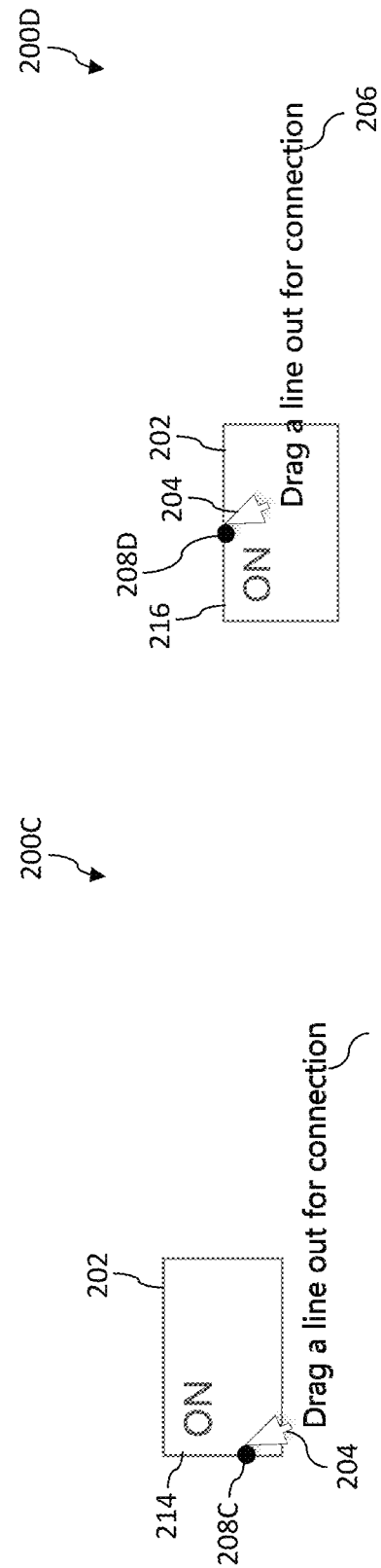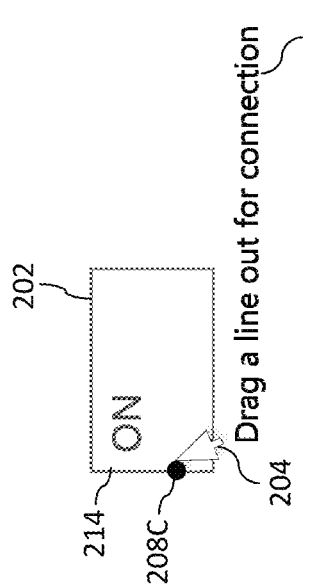

GRAPHIC FLOW HAVING UNLIMITED NUMBER OF CONNECTIONS BETWEEN SHAPES

CROSS-REFERENCE TO RELATED APPLICATIONS

This application is a continuation of U.S. patent application Ser. No. 15/179,027, entitled "GRAPHIC FLOW HAVING UNLIMITED NUMBER OF CONNECTIONS BETWEEN SHAPES," filed Jun. 10, 2016, which is a continuation of U.S. patent application Ser. No. 13/307,720; now U.S. Pat. No. 9,367,201, entitled "GRAPHIC FLOW HAVING UNLIMITED NUMBER OF CONNECTIONS BETWEEN SHAPES," filed Nov. 30, 2011, which are incorporated herein by reference in their entireties.

BACKGROUND

Graphical flows are diagrams that represent relationships between various entities. Shapes typically are used to represent the entities, and arrows often are used to represent the relationships between the entities. One example type of graphical flow is a flowchart. In a flowchart, shapes represent steps in a process, and arrows represent flow of control between the steps. Another example type of graphical flow is a state machine. In a state machine, shapes represent states of a system, and arrows represent transitions between the states. Each transition includes an action that is triggered by an event or a condition. The event or condition that triggers a transition is denoted by the starting point of the arrow that represents that transition.

Graphical software programs commonly are used to generate and/or modify graphical flows. For instance, a user may interact with such a graphical software program via an interface to place shapes and to draw arrows between those shapes. However, conventional graphical software programs often limit a number of points on each shape to which arrows may be connected to a relative small predetermined number (e.g., four), and such points often are fixed at predetermined locations on the shape (e.g., at a midpoint of each side of the shape).

It may be desirable to create a substantial number of connections between shapes. Moreover, it may be desirable for connections from a specified shape to start at different points on a border of the specified shape. Accordingly, a number of connections from the specified shape may exceed a number allowed by a conventional graphical software program. In the context of a state machine, a number of possible events and/or conditions that are capable of triggering a transition from a specified state may exceed a number of points on a corresponding shape in the graphical flow to which arrows may be connected.

SUMMARY

Various approaches are described herein for, among other things, generating a graphical flow having an unlimited number of connections between shapes. Each connection is defined by a starting connection point and an ending connection point. The shapes are provided in a visual representation of a workspace that is defined by pixels. Each shape has an outer boundary that is defined by a respective subset of the pixels. For instance, a first shape may have an outer perimeter defined by a first subset of the pixels; a second shape may have an outer boundary defined by a second subset of the pixels, and so on. Any of the pixels in each subset may serve as a connection point. For example, a first pixel of the first subset may serve as a first connection point based on any of a variety of first criteria, and a second pixel of the second subset may serve as a second connection point based on any of a variety of second criteria. In accordance with this example, a connection may be provided between the first connection point and the second connection point.

A method is described in which information regarding a visual representation of a workspace is provided toward a user interface. The visual representation is defined by pixels. A first shape is provided in the workspace. The first shape has an outer perimeter that is defined by a first subset of the pixels. A determination is made that a selection action is initiated while a cursor is located at a first location in the workspace. A first pixel of the first subset is determined for which a distance between the first pixel and the first location is not greater than a distance between each other pixel of the first subset and the first location. A determination is made that a release action is initiated while the cursor is located at a second location in the workspace. A connection is provided between the first pixel and a second pixel that is included in a second subset of the pixels. The second subset defines an outer boundary of a second shape. A distance between the second pixel and the second location is not greater than a distance between each other pixel of the second subset and the second location.

Another method is described. In accordance with this method, information regarding a visual representation of a workspace is provided toward a user interface. The visual representation is defined by pixels. A first shape is provided in the workspace. The first shape has an outer perimeter that is defined by a first subset of the pixels. The first subset includes a series of adjacent pixels for each side of the first shape. Each pixel in the first subset is selectable as a first connection point. A second shape is provided in the workspace. The second shape has an outer perimeter that is defined by a second subset of the pixels. The second subset includes a series of adjacent pixels for each side of the second shape. Each pixel in the second subset is selectable as a second connection point. A determination is made that a selection action is initiated while a cursor is located at a first location within a first specified proximity to the first shape in the workspace. A determination is made that a release action is initiated while the cursor is located at a second location in the workspace. A first pixel of the first subset of pixels is selected to be the first connection point based on one or more first criteria. A second pixel of the second subset of pixels is selected to be the second connection point based on one or more second criteria. A connection is provided between the first connection point and the second connection point.

A system is described that includes workspace logic, shape logic, action logic, distance logic, and connection logic. The workspace logic is configured to provide information regarding a visual representation of a workspace toward a user interface. The visual representation is defined by pixels. The shape logic is configured to provide a first shape in the workspace. The first shape has an outer perimeter that is defined by a first subset of the pixels. The action logic is configured to determine that a selection action is initiated. The action logic is further configured to determine that a release action is initiated. The selection action is initiated while a cursor is located at a first location in the workspace. The release action is initiated while the cursor is located at a second location in the workspace. The distance logic is configured to determine a first pixel of the first subset for which a distance between the first pixel and the first location is not greater than a distance between each other pixel of the first subset and the first location. The connection logic is configured to provide a connection between the first pixel and a second pixel that is included in a second subset of the pixels. The second subset defines an outer boundary of a second shape. A distance between the second pixel and the second location is not greater than a distance between each other pixel of the second subset and the second location.

Another system is described. The system includes workspace logic, shape logic, action logic, pixel selection logic, and connection logic. The workspace logic is configured to provide information regarding a visual representation of a workspace toward a user interface. The visual representation is defined by pixels. The shape logic is configured to provide a first shape in the workspace. The first shape has an outer perimeter that is defined by a first subset of the pixels. The first subset includes a series of adjacent pixels for each side of the first shape. Each pixel in the first subset is selectable as a first connection point. The space logic is further configured to provide a second shape in the workspace. The second shape has an outer perimeter that is defined by a second subset of the pixels. The second subset includes a series of adjacent pixels for each side of the second shape. Each pixel in the second subset is selectable as a second connection point. The action logic is configured to determine that a selection action is initiated. The action logic is further configured to determine that a release action is initiated. The selection action is initiated while a cursor is located at a first location within a first specified proximity to the first shape in the workspace. The release action is initiated while the cursor is located at a second location in the workspace. The pixel selection logic is configured to select a first pixel of the first subset of pixels to be the first connection point based on one or more first criteria. The pixel selection logic is further configured to select a second pixel of the second subset of pixels to be the second connection point based on one or more second criteria. The connection logic is configured to provide a connection between the first connection point and the second connection point.

A computer program product is described that includes a computer-readable medium having computer program logic recorded thereon for enabling a processor-based system to generate a graphic flow having an unlimited number of connections between shapes. The computer program product includes first, second, third, fourth, fifth, and sixth program logic modules. The first program logic module is for enabling the processor-based system to provide information regarding a visual representation of a workspace toward a user interface. The visual representation is defined by pixels. The second program logic module is for enabling the processor-based system to provide a first shape in the workspace. The first shape has an outer perimeter that is defined by a first subset of the pixels. The third program logic module is for enabling the processor-based system to determine that a selection action is initiated. The selection action is initiated while a cursor is located at a first location in the workspace. The fourth program logic module is for enabling the processor-based system to determine a first pixel of the first subset for which a distance between the first pixel and the first location is not greater than a distance between each other pixel of the first subset and the first location. The fifth program logic module is for enabling the processor-based system to determine that a release action is initiated. The release action is initiated while the cursor is located at a second location in the workspace. The sixth program logic module is for enabling the processor-based system to provide a connection between the first pixel and a second pixel that is included in a second subset of the pixels. The second subset defines an outer boundary of a second shape. A distance between the second pixel and the second location is not greater than a distance between each other pixel of the second subset and the second location.

Another computer program product is described that includes a computer-readable medium having computer program logic recorded thereon for enabling a processor-based system to generate a graphic flow having an unlimited number of connections between shapes. The computer program product includes first, second, third, fourth, fifth, sixth, seventh, and eighth program logic modules. The first program logic module is for enabling the processor-based system to provide information regarding a visual representation of a workspace toward a user interface. The visual representation is defined by pixels. The second program logic module is for enabling the processor-based system to provide a first shape in the workspace. The first shape has an outer perimeter that is defined by a first subset of the pixels. The first subset includes a series of adjacent pixels for each side of the first shape. Each pixel in the first subset is selectable as a first connection point. The third program logic module is for enabling the processor-based system to provide a second shape in the workspace. The second shape has an outer perimeter that is defined by a second subset of the pixels. The second subset includes a series of adjacent pixels for each side of the second shape. Each pixel in the second subset is selectable as a second connection point. The fourth program logic module is for enabling the processor-based system to determine that a selection action is initiated. The selection action is initiated while a cursor is located at a first location within a first specified proximity to the first shape in the workspace. The fifth program logic module is for enabling the processor-based system to determine that a release action is initiated. The release action is initiated while the cursor is located at a second location in the workspace. The sixth program logic module is for enabling the processor-based system to select a first pixel of the first subset of pixels to be the first connection point based on one or more first criteria. The seventh program logic module is for enabling the processor-based system to select a second pixel of the second subset of pixels to be the second connection point based on one or more second criteria. The eighth program logic module is for enabling the processor-based system to provide a connection between the first connection point and the second connection point.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the invention is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles involved and to enable a person skilled in the relevant art(s) to make and use the disclosed technologies.

FIG. 1 is a block diagram of an example computer system in accordance with an embodiment.

FIGS. 2A, 2B, 2C, and 2D show respective example diagrams that illustrate interaction of a cursor with a shape in accordance with embodiments.

FIGS. 3A, 3B, 3C, 3D, and 3E depict respective steps in an example process for generating a connection between shapes in a graphic flow in accordance with embodiments.

FIGS. 4A, 4B, 4C, and 4D depict respective steps in another example process for generating a connection between shapes in a graphic flow in accordance with embodiments.

Figure 1:
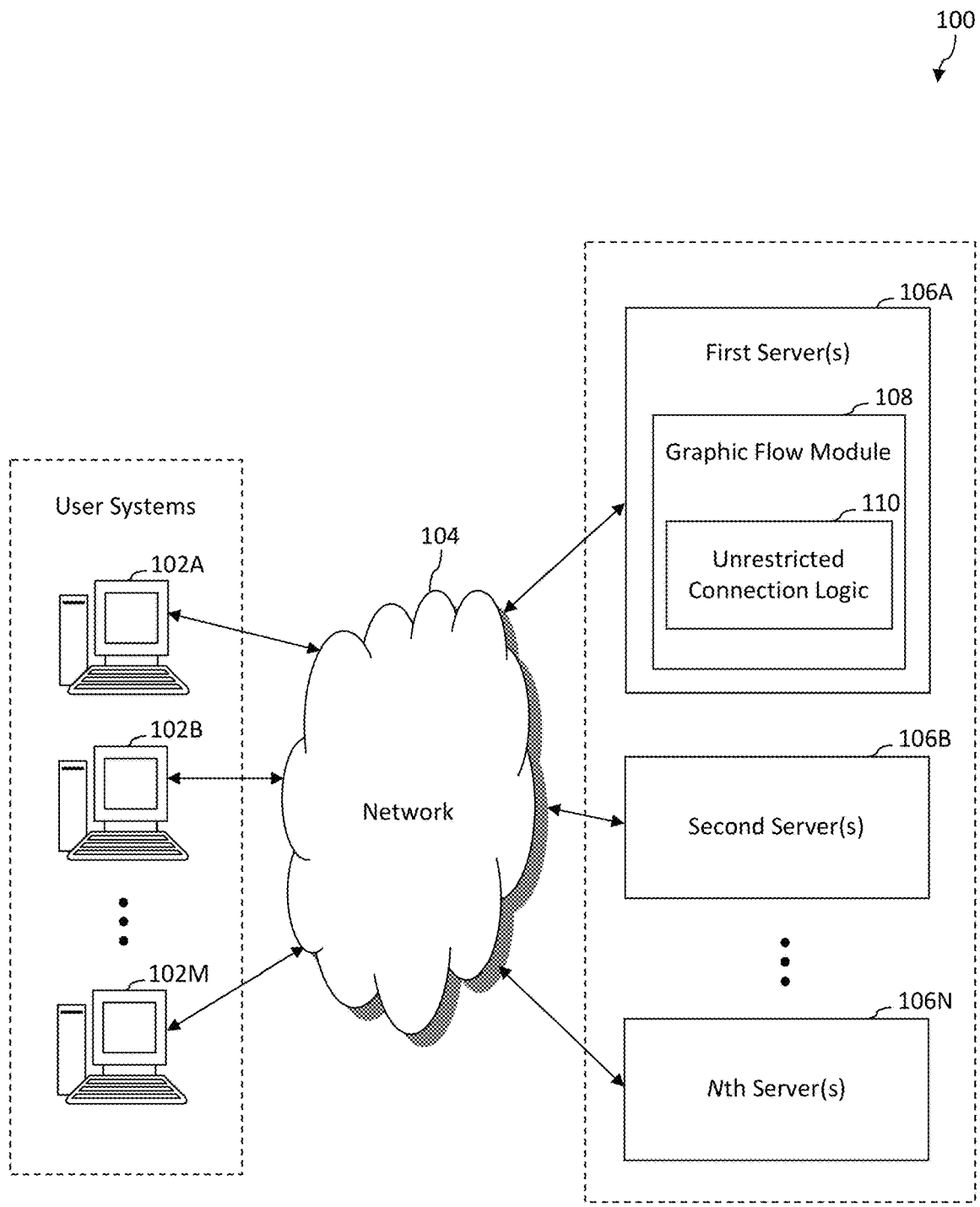

The features and advantages of the disclosed technologies will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.ggg

DETAILED DESCRIPTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the relevant art(s) to implement such feature, structure, or characteristic in connection with other embodiments whether or not explicitly described.

II. Example Embodiments

Example embodiments described herein are capable of generating a graphic flow having an unlimited number of connections between shapes. Each connection is defined by a starting connection point and an ending connection point. The shapes are provided in a visual representation of a workspace that is defined by pixels. Each shape has an outer boundary that is defined by a respective subset of the pixels. For instance, a first shape may have an outer perimeter defined by a first subset of the pixels; a second shape may have an outer boundary defined by a second subset of the pixels, and so on. Any of the pixels in each subset may serve as a connection point. For example, a first pixel of the first subset may serve as a first connection point based on any of a variety of first criteria, and a second pixel of the second subset may serve as a second connection point based on any of a variety of second criteria. In accordance with this example, a connection may be provided between the first connection point and the second connection point.

Each of the shapes described herein may be any suitable type of shape. Example types of a shape include a circle, oval, triangle, quadrilateral (e.g., square, rectangle, rhombus, trapezoid), pentagon, hexagon, etc. Each shape has at least one side. For instance, a circle has one side that coincides with an outer perimeter of the circle. An oval has one side that coincides with an outer perimeter of the oval. A triangle has three sides. A quadrilateral has four sides. A pentagon has five sides. A hexagon has six sides, and so on.

Example techniques described herein have a variety of benefits as compared to conventional techniques for generating graphic flows. For instance, the example techniques may allow any pixel in a perimeter of a shape to serve as a connection point. The example techniques may be capable of dynamically creating a shape in a workspace in response to provision of a connection between a first location that corresponds to an existing shape in the workspace and a second location that does not correspond to another existing shape. In the context of a state machine, the example techniques may not limit a number of possible events and/or conditions that are capable of triggering a transition from a specified state. Some example techniques may be performed without the use of a keyboard (e.g., in absence of a keyboard). For instance, such example techniques may be performed using a touch-based computing device. A touch-based computing device is a computing device that has a tactile interface through which instructions are received via touch commands. For instance, a user may press the interface with a finger or stylus to initiate an instruction.

FIG. 1 is a block diagram of an example computer system 100 in accordance with an embodiment. Generally speaking, computer system 100 operates to provide information to users in response to requests (e.g., hypertext transfer protocol (HTTP) requests) that are received from the users. The information may include documents (e.g., Web pages, images, video files, etc.), output of executables, and/or any other suitable type of information. In accordance with example embodiment described herein, computer system 100 generates and/or modifies graphic flows in response to such requests from the users. Detail regarding techniques for generating a graphic flow having unlimited connections between shapes is provided in the following discussion.

As shown in FIG. 1, computer system 100 includes a plurality of user systems 102A-102M, a network 104, and a plurality of servers 106A-106N. Communication among user systems 102A-102M and servers 106A-106N is carried out over network 104 using well-known network communication protocols. Network 104 may be a wide-area network (e.g., the Internet), a local area network (LAN), another type of network, or a combination thereof.

User systems 102A-102M are processing systems that are capable of communicating with servers 106A-106N. An example of a processing system is a system that includes at least one processor that is capable of manipulating data in accordance with a set of instructions. For instance, a processing system may be a computer, a personal digital assistant, etc. User systems 102A-102M are configured to provide requests to servers 106A-106N for requesting information stored on (or otherwise accessible via) servers 106A-106N. For instance, a user may initiate a request for generation and/or modification of a graphic flow using a client (e.g., a Web browser, Web crawler, or other type of client) deployed on a user system 102 that is owned by or otherwise accessible to the user. In accordance with some example embodiments, user systems 102A-102M are capable of accessing domains (e.g., Web sites) hosted by servers 104A-104N, so that user systems 102A-102M may access information that is available via the Web sites. Such Web sites include Web pages, which may be provided as hypertext markup language (HTML) documents and objects (e.g., files) that are linked therein, for example.

It will be recognized that any one or more user systems 102A-102M may communicate with any one or more servers 106A-106N. Although user systems 102A-102M are depicted as desktop computers in FIG. 1, persons skilled in the relevant art(s) will appreciate that user systems 102A-102M may include any client-enabled system or device, including but not limited to a desktop computer, a laptop computer, a tablet computer, a personal digital assistant, a cellular telephone, or the like.

Servers 106A-106N are processing systems that are capable of communicating with user systems 102A-102M. Servers 106A-106N are configured to execute software programs that provide information to users in response to receiving requests from the users. For example, the information may include documents (e.g., Web pages, images, video files, etc.), output of executables, or any other suitable type of information. In accordance with some example embodiments, servers 106A-106N are configured to host respective Web sites, so that the Web sites are accessible to users of computer system 100.

One type of software program that may be executed by any one or more of servers 106A-106N is a graphic flow program. A graphic flow program is executed by a server to generate and/or modify graphic flows based on instructions that are provided by users. Such instructions may specify that a shape is to be created in a workspace, a shape is to be deleted from the workspace, a shape is to be moved within the workspace, a type of a shape is to be changed, a connection is to be created in the workspace, a connection is to be deleted from the workspace, an existing connection is to be moved within the workspace, value(s) of one or more properties associated with a connection are to be changed, etc. First server(s) 106A is shown to include graphic flow module 108 for illustrative purposes. Graphic flow module 108 is configured to execute a graphic flow program. For instance, graphic flow module 108 may perform operations with respect to a graphic flow in response to instructions and provide information regarding a visual representation of the graphic flow to a user system from which the instructions are received.

Graphic flow module 108 includes unrestricted connection logic 110. Unrestricted connection logic 110 is configured to enable generation of a graphic flow having an unlimited number of connections between shapes. Some example techniques for generating a graphic flow having an unlimited number of connections between shapes are discussed in greater detail below with reference to FIGS. 2A-2D, 3A-3E, 4A-4D, 5A-5B, 6, and 7.

Graphic flow module 108 and unrestricted connection logic 110 are shown to be incorporated in first server(s) 106A for illustrative purposes and are not intended to be limiting. It will be recognized that graphic flow module 108 and unrestricted connection logic 110 (or any portion thereof) may be incorporated in any one or more of the user systems 102A-102M. For example, client-side aspects of graphic flow module 108 and/or unrestricted connection logic 110 may be incorporated in one or more of the user systems 102A-102M, and server-side aspects of graphic flow module 108 and/or unrestricted connection logic 110 may be incorporated in first server(s) 106A. In another example, graphic flow module 108 and unrestricted connection logic 110 may be distributed among the user systems 102A-102M. In another example, graphic flow module 108 and unrestricted connection logic 110 may be incorporated in a single one of the user systems 102A-102M.

Unrestricted connection logic 110 may be implemented in various ways to generate a graphic flow having an unlimited number of connections between shapes, including being implemented in hardware, software, firmware, or any combination thereof. For example, unrestricted connection logic 110 may be implemented as computer program code configured to be executed in one or more processors. In another example, unrestricted connection logic 110 may be implemented as hardware logic/electrical circuitry. In an embodiment, unrestricted connection logic 110 may be implemented in a system-on-chip (SoC). Each SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

FIGS. 2A, 2B, 2C, and 2D show respective example diagrams 200A, 200B, 200C, and 200D that illustrate interaction of a cursor 204 with a shape 202 in accordance with embodiments. As shown in FIG. 2A, the cursor 204 is placed proximate a first side 210 of the shape 202. A first pixel 208A, which is among a first subset of pixels that define the first side 210, is highlighted when the cursor 204 comes within a specified proximity to the first side 210. For instance, the first pixel 208A may be highlighted based on a proximity of the cursor 204 to the first pixel 208A being closer than a proximity of the cursor 204 to each of the other pixels in the first subset. A hint 206 is provided along with the cursor 204 to provide information regarding an action that may be taken based on the cursor 204 being proximate the first side 210 of the shape 202. For instance, the hint 206 may be provided in response to the cursor 204 being within the specified proximity to the first side 210 for at least a designated period of time (e.g., one second, two seconds, etc.). In the embodiment of FIG. 2A, hint 206 specifies that a line may be dragged from the first pixel 208A to create a connection. It will be recognized that hint 206 may specify any suitable information.

As shown in FIG. 2B, the cursor 204 is placed proximate a second side 212 of the shape 202. A second pixel 208B, which is among a second subset of pixels that define the second side 212, is highlighted when the cursor 204 comes within a specified proximity to the second side 212. For instance, the cursor 204 may be moved from a first location proximate the first pixel 208A to a second location proximate the second pixel 208B in response to an instruction that is received from a user. As shown in FIG. 2C, the cursor 204 is placed proximate a third side 214 of the shape 202, causing a third pixel 208C, which is among a third subset of pixels that define the third side 214, to be highlighted. As shown in FIG. 2D, the cursor 204 is placed proximate a fourth side 216 of the shape 202, causing a fourth pixel 208D, which is among a fourth subset of pixels that define the fourth side 216, to be highlighted.

Figure 3A:

FIGS. 3A, 3B, 3C, 3D, and 3E depict respective steps 300A, 300B, 300C, 300D, and 300E in an example process for generating a connection between shapes 302 and 304 in a graphic flow in accordance with embodiments. As shown in FIG. 3A, the initial (e.g., default) status of the shapes 302 and 304 is to have no connections therebetween.

Figure 3B:
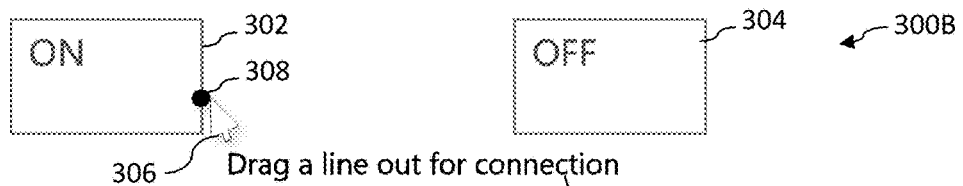

In FIG. 3B, a cursor 306 is shown to hover near a first pixel 308, which is included along an outer perimeter of the first shape 302. The first pixel 308 is shown to be highlighted based on its proximity to the cursor 306. For instance, a distance between the cursor 306 and the first pixel 308 may be no greater than (e.g., less than) a distance between the cursor 306 and each other pixel that is included along the outer perimeter of the first shape 302. The first pixel 308 may be highlighted automatically based on the cursor 308 being within a specified proximity to the first shape 302 and further based on the distance between the cursor 386 and the first pixel 308 being no greater than the distance between the cursor 306 and each other pixel that is included along the outer perimeter of the first shape 302. The first pixel 308 may be highlighted further based on one or more other criteria, such as the cursor 306 hovering proximate the first shape 302 for a specified duration of time, a selection action being performed by a user. For instance, the user may press (or press and hold) a mouse button, press (or press and hold) a finger or stylus against a display screen, speak a selection command, etc. A hint 310 is associated with the cursor 306. The hint 310 specifies that a line may be dragged out from the first pixel 308 to create a connection.

Figure 3C:
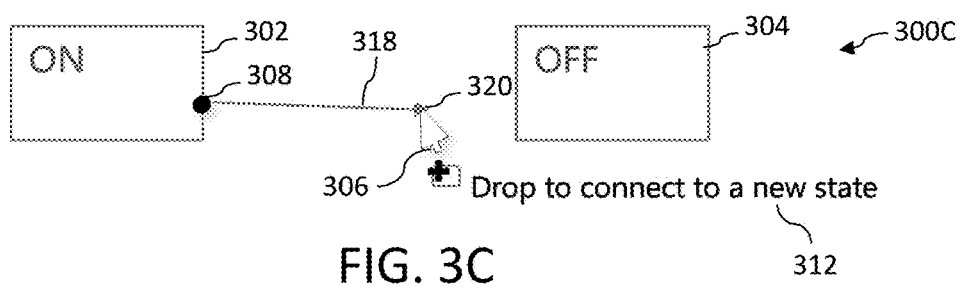

As shown in FIG. 3C, a connection 318 is initiated from the first pixel 308 in response to the user performing a selection command. A hint 312 is associated with the cursor 306. The hint 312 specifies that a release action may be performed to connect the first pixel 308 of the first shape 302 to a new shape via connection 318. Note that the cursor 306 is at a location 320 in FIG. 3C that is not within a specified proximity to the second shape 304. Accordingly, if the user performs the release action while the cursor 306 is at location 320, a new shape is to be created, and the first pixel 308 is to be connected to the new shape (rather than the second shape 304) via connection 318.

Figure 3D:
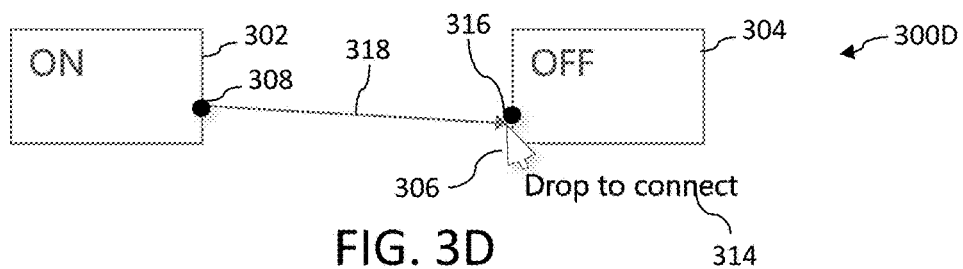

As shown in FIG. 3D, the cursor 306 is shown to be within the specified proximity to the second shape 304. Thus, a second pixel 316, which is included along an outer perimeter of the second shape 304, is highlighted. A hint 314 is associated with the cursor 306. The hint 314 specifies that a release action may be performed to connect the first pixel 308 to the second pixel 316 via connection 318.

Figure 3E:
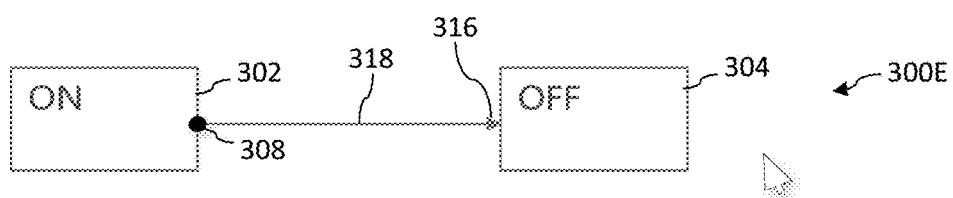

In FIG. 3E, the connection 318 is shown to be provided between the first shape 302 and the second shape 304. More specifically, the connection 318 is shown to be provided between the first pixel 308 and the second pixel 316 in response to the user performing the release action while the cursor 306 is located proximate the second pixel 316. For instance, the user may press (or release) a mouse button, press a finger or stylus against (or release the same from) a display screen, speak a release command, etc. Upon provision of the connection 318, a location of the first pixel 308 is represented by a solid circle for illustrative purposes to indicate that the first pixel 308 corresponds to a starting connection point of the connection 318. A location of the second pixel 316 is represented by an arrowhead for illustrative purposes to indicate that the second pixel 316 corresponds to an ending connection point of the connection 318. It will be recognized that a starting connection point and an ending connection point may be identified by any suitable elements (e.g., shapes, objects, etc.).

Figure 4A:
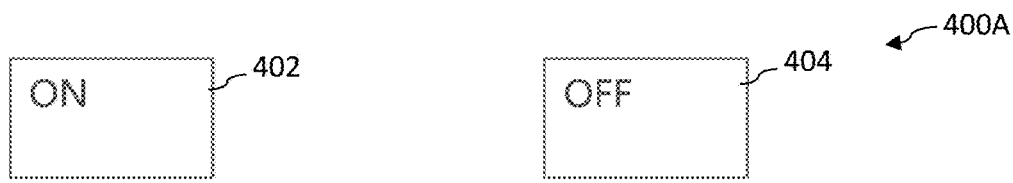

FIGS. 4A, 4B, 4C, and 4D depict respective steps 400A, 400B, 400C, and 400D in another example process for generating a connection between shapes in a graphic flow in accordance with embodiments. As shown in FIG. 4A, the initial (e.g., default) status of the shapes 402 and 404 is to have no connections therebetween.

Figure 4B:
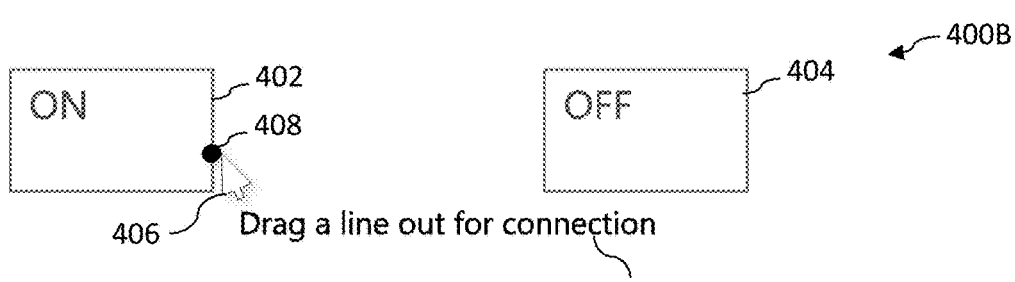

FIG. 4B is similar to FIG. 3B in that a cursor 406 is shown to hover near a first pixel 408, which is included along an outer perimeter of the first shape 402. The first pixel 408 is shown to be highlighted based on its proximity to the cursor 406. A hint 410 is associated with the cursor 406 to specify that a line may be dragged out from the first pixel 408 to create a connection.

Figure 4C:
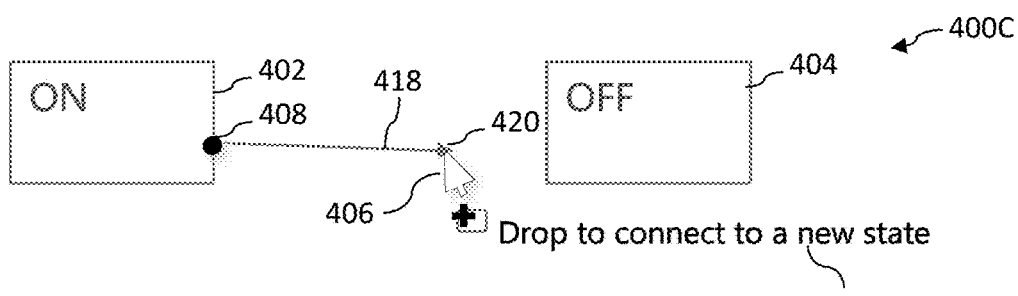

FIG. 4C is similar to FIG. 3C in that a connection 418 is initiated from the first pixel 408 in response to the user performing a selection command. The cursor 306 is shown to be at a location 420 that is not within a specified proximity to the second shape 404A. Hint 412 is associated with the cursor 406 to specify that a release action may be performed while the cursor is at the location 420 to connect the first pixel 408 of the first shape 402 to a new shape via connection 418.

Figure 4D:
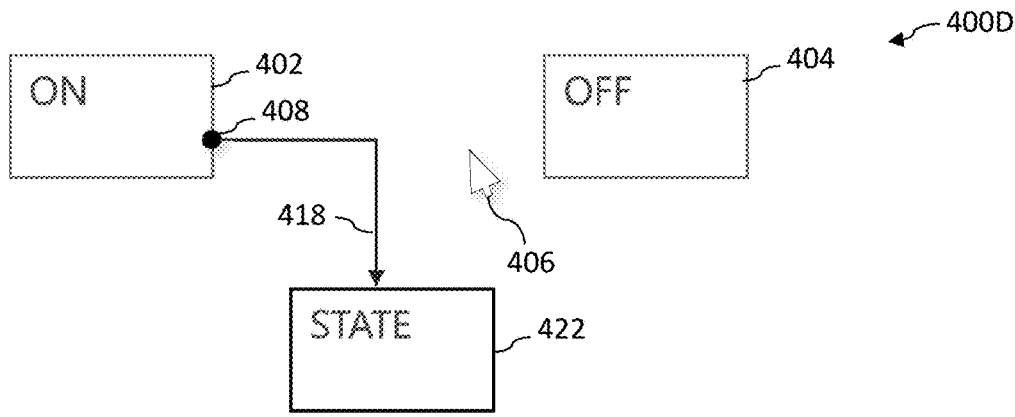

In FIG. 4D, a new shape 422 is shown to be created in response to the user performing the release action while the cursor 406 is at location 420. The new shape 422 is not provided at the location 422 for illustrative purposes. Rather, the new shape 422 is provided such that the new shape 422 does not overlap the first shape 402 and/or the second shape 404. The connection 418 is adjusted accordingly. For instance, the connection 418 is shown to include a ninety-degree bend to accommodate the location of the new shape 422.

Figure 5A:
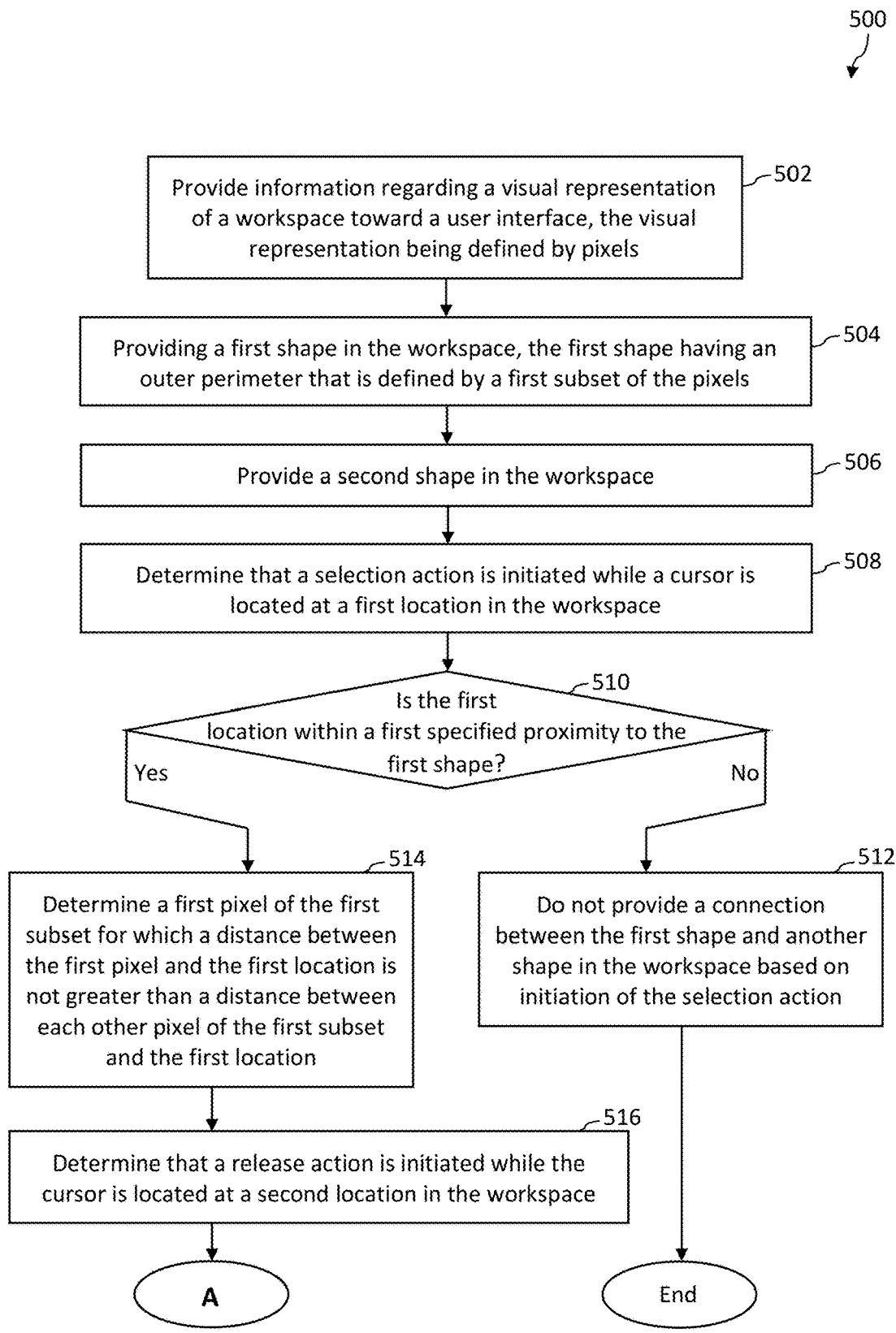
FIGS. 5A and 5B depict respective portions of a flowchart of an example method for generating a graphical flow in accordance with an embodiment.
Figure 5B:
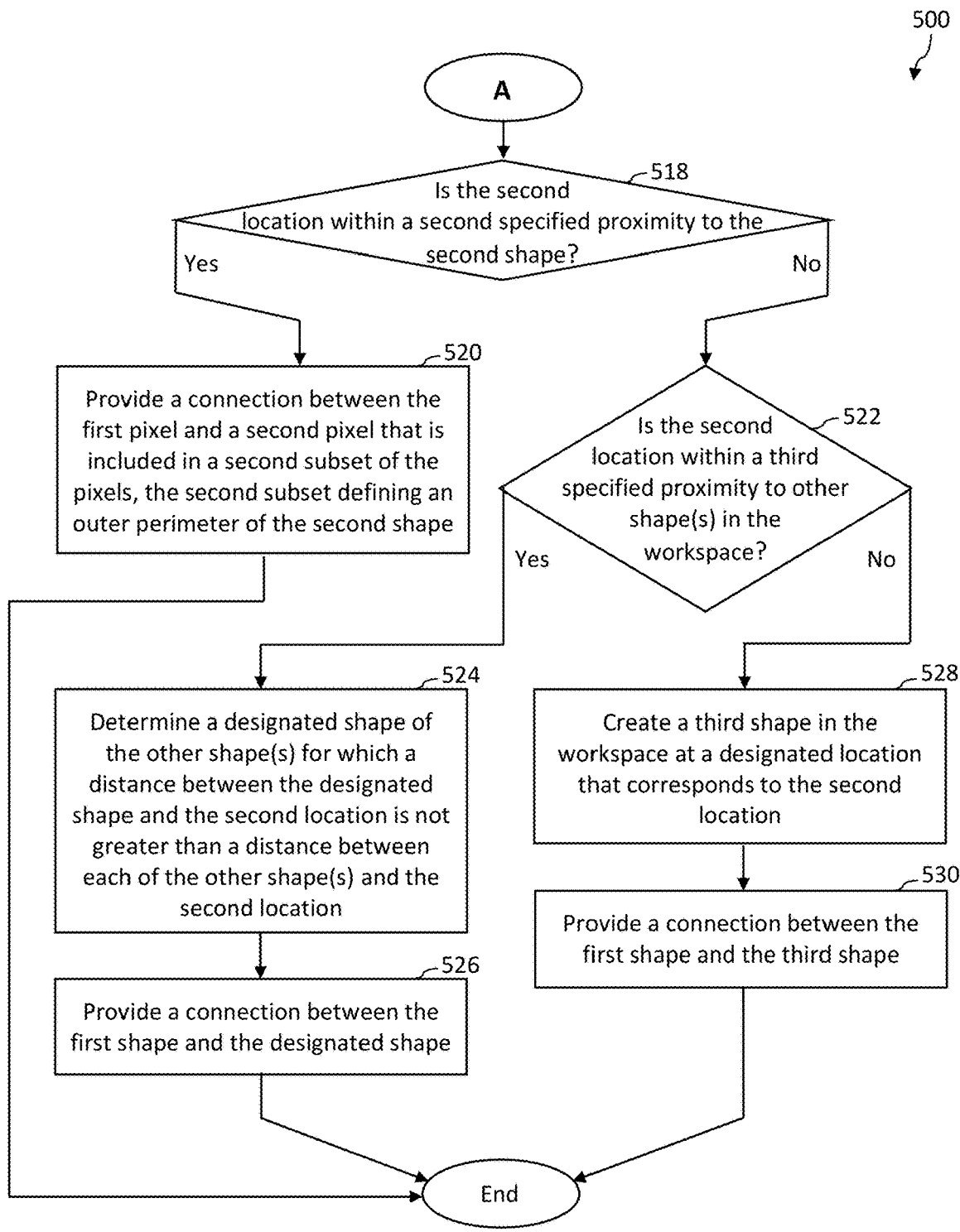
Figure 6:
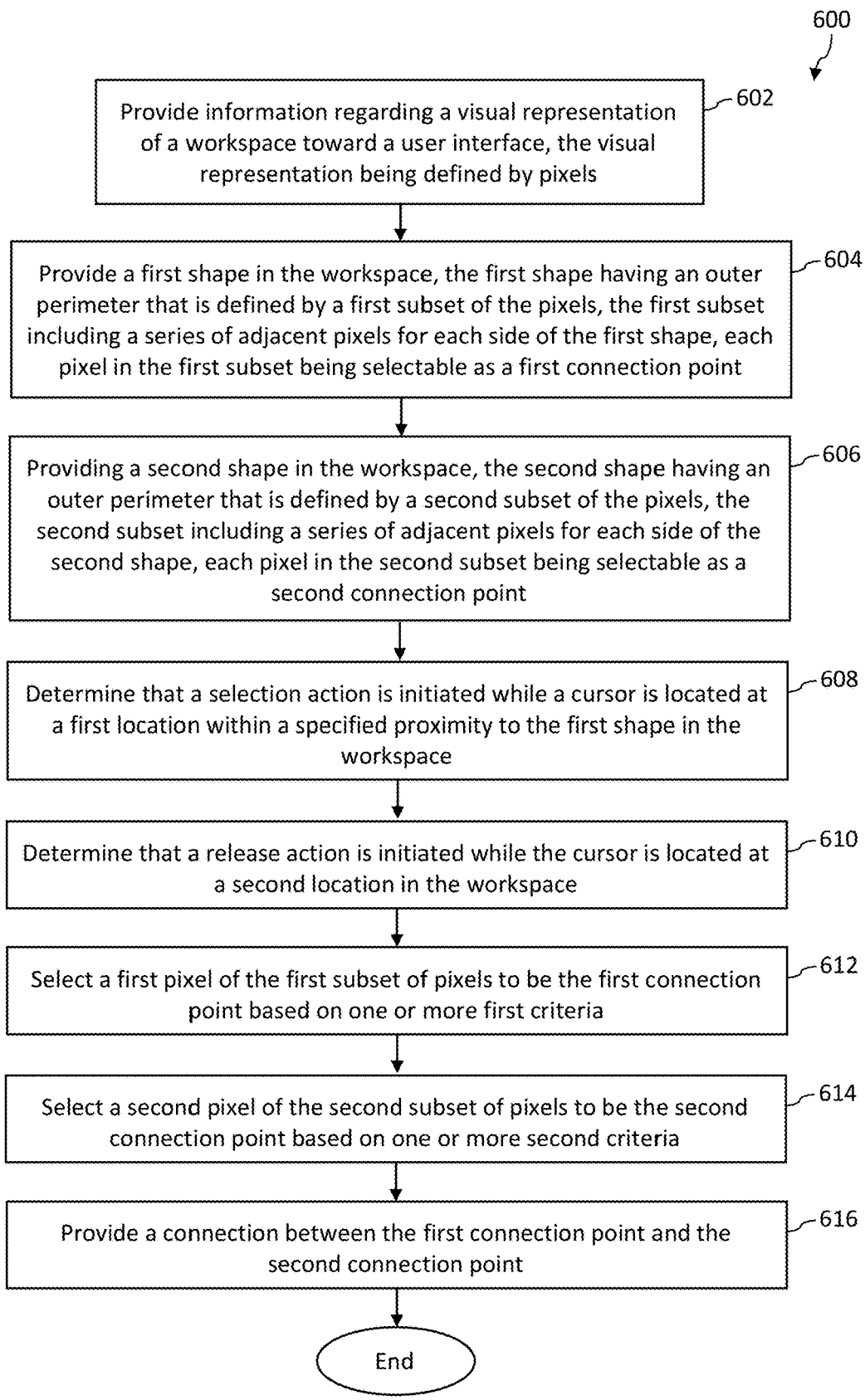
FIG. 6 depicts a flowchart of another example method for generating a graphical flow in accordance with an embodiment.
Figure 7:
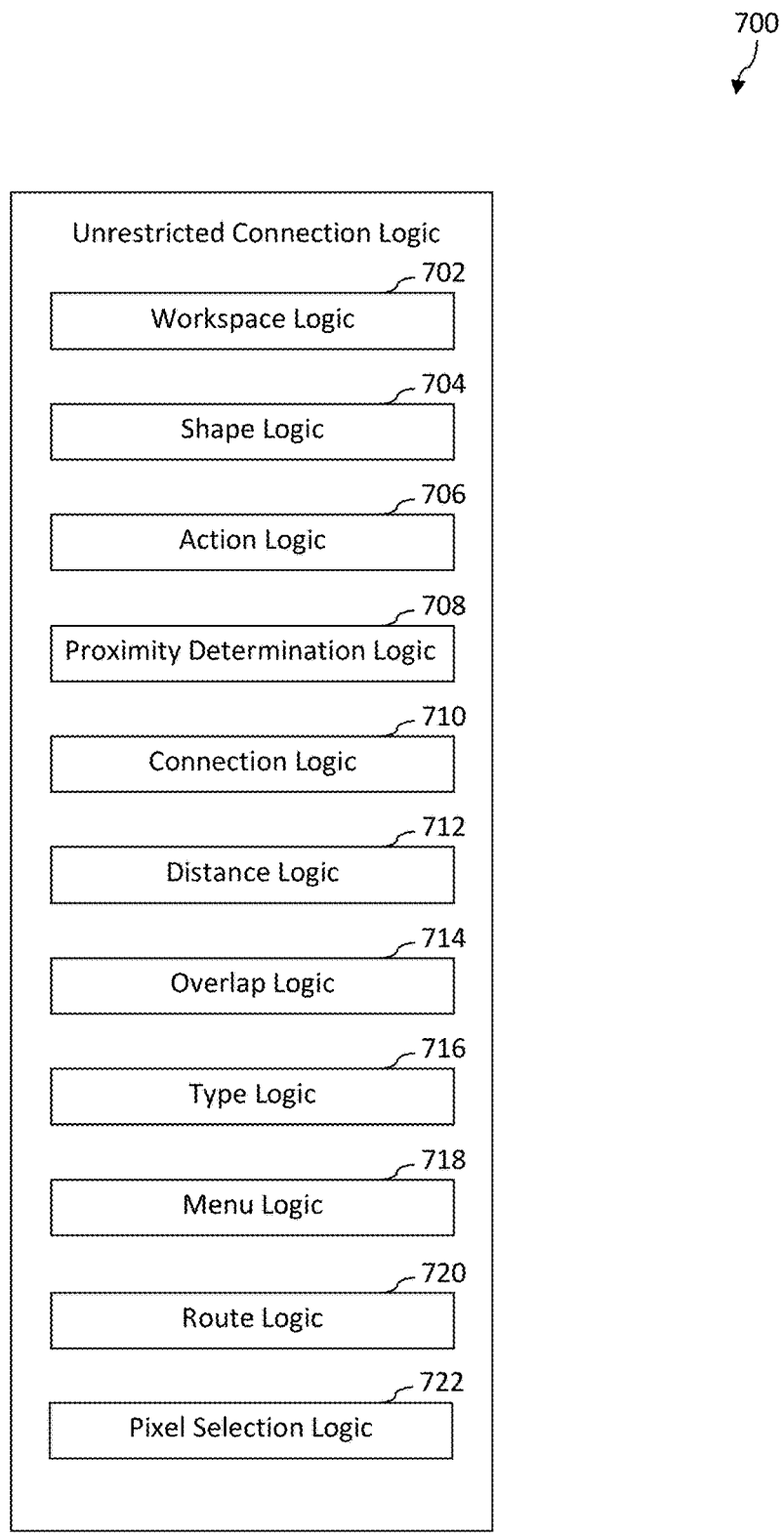
FIG. 7 is a block diagram of an example implementation of unrestricted connection logic shown in FIG. 1 in accordance with an embodiment.

FIGS. 5A and 5B depict respective portions of a flowchart of an example method for generating a graphical flow in accordance with an embodiment. FIG. 6 depicts a flowchart of another example method for generating a graphical flow in accordance with an embodiment. Flowcharts 500 and 600 may be performed by unrestricted connection logic 110 of device 100 shown in FIG. 1, for example. For illustrative purposes, flowcharts 500 and 600 are described with respect to unrestricted connection logic 700 shown in FIG. 7, which is an example of unrestricted connection logic 110, according to an embodiment. As shown in FIG. 7, unrestricted connection logic 700 includes workspace logic 702, shape logic 704, action logic 706, proximity determination logic 708, connection logic 710, distance logic 712, overlap logic 714, type logic 716, menu logic 718, route logic 720, and pixel selection logic 722. Further structural and operational embodiments will be apparent to persons skilled in the relevant art(s) based on the discussion regarding flowcharts 500 and 600.

As shown in FIG. 5A, the method of flowchart 500 begins at step 502. In step 502, information regarding a visual representation of a workspace is provided toward a user interface. The visual representation is defined by pixels. For instance the pixels may be arranged as an array (e.g., grid) of pixels that includes a plurality of rows and a plurality of columns. In an example implementation, workspace logic 702 provides the information regarding the visual representation of the workspace.

At step 504, a first shape is provided in the workspace. The first shape has an outer perimeter that is defined by a first subset of the pixels. In an example implementation, shape logic 704 provides the first shape in the workspace.

At step 506, a second shape is provided in the workspace. In an example implementation, shape logic provides the second shape in the workspace.

At step 508, a determination is made that a selection action is initiated while a cursor is located at a first location in the workspace. For instance, the determination that the selection action is initiated may be based on detecting that a button on a computer mouse device is pressed (or pressed and held for at least a designated period of time), based on detecting that an object such as a finger or a stylus is pressed (or pressed and held for at least a designated period of time) against a display surface, based on detecting that such an object is placed within a designated proximity of a display surface (e.g., for at least a designated period of time), etc. while the cursor is located at the first location. In an example implementation, action logic 706 determines that the selection action is initiated while the cursor is located at the first location.

At step 510, a determination is made whether the first location is within a first specified proximity to the first shape. The first specified proximity may be defined to require the first location to be within an area that is defined by the first shape, within a specified distance from an area that is defined by the first shape, within a specified distance from the first subset of the pixels, coincident with the first subset of the pixels, coincident with an area that is defined by the first shape, etc. If the first location is within the first specified proximity to the first shape, flow continues to step 514. Otherwise, flow continues to step 512. In an example implementation, proximity determination logic 708 determines whether the first location is within the first specified proximity to the first shape.

At step 512, a connection is not provided between the first shape and another shape in the workspace based on initiation of the selection action. In an example implementation, connection logic 710 does not provide a connection between the first shape and another shape in the workspace based on initiation of the selection action. Upon completion of step 512, flowchart 500 ends.

At step 514, a first pixel of the first subset is determined for which a distance between the first pixel and the first location is not greater than a distance between each other pixel of the first subset and the first location. For instance, the first pixel may be determined based on the distance between the first pixel and the first location being less than the distance between each other pixel of the first subset and the first location. It should be noted that the first pixel may be highlight (e.g., brightened, enlarged, caused to blink, caused to change color, etc.) in response to the cursor being located at or within a specified distance from the first pixel. The specified distance may or may not correspond to the first specified proximity that is discussed above with reference to step 510. In an example implementation, distance logic 712 determines the first pixel of the first subset.

In an example embodiment, step 510 is performed in response to step 514. In accordance with this embodiment, the determination whether the first location is within the first specified proximity to the first shape at step 510 may be based on whether the first location is within the first specified proximity to the first pixel, which is described with reference to step 514.

At step 516, a determination is made that a release action is initiated while the cursor is located at a second location in the workspace. In an example implementation, action logic 706 determines that the release action is initiated while the cursor is located at the second location. Upon completion of step 516, flow continues to step 518, which is shown in FIG. 5B.

At step 518, a determination is made whether the second location is within a second specified proximity to the second shape. The second specified proximity may be defined to require the second location to be within an area that is defined by the second shape, within a specified distance from an area that is defined by the second shape, within a specified distance from the second subset of the pixels, coincident with a second subset of the pixels that defines an outer perimeter of the second shape, coincident with an area that is defined by the second shape, etc. If the second location is within the second specified proximity to the second shape, flow continues to step 520. Otherwise, flow continues to step 522. In an example implementation, proximity logic 708 determines whether the second location is within the second specified proximity to the second shape.

At step 520, a connection is provided between the first pixel and a second pixel that is included in a second subset of the pixels. For instance, the connection may be drawn between the first pixel and the second pixel. The second subset defines the outer boundary of the second shape. A distance between the second pixel and the second location may not be greater than (e.g., may be less than) a distance between each other pixel of the second subset and the second location. It should be noted that the second pixel may be highlight (e.g., brightened, enlarged, caused to blink, caused to change color, etc.) in response to the cursor being located at or within a specified distance from the second pixel. The specified distance may or may not correspond to the second specified proximity that is discussed above with reference to step 518. In an example implementation, connection logic 710 provides a connection between the first pixel and the second pixel. Upon completion of step 520, flowchart 500 ends.

In an example embodiment, the determination whether the second location is within the second specified proximity to the second shape at step 518 may be based on whether the second location is within the second specified proximity to the second pixel, which is described with reference to step 520.

At step 522, a determination is made whether the second location is within a third specified proximity to other shape(s) in the workspace. The third specified proximity may be defined to require the second location to be within an area that is defined by another shape, within a specified distance from an area that is defined by another shape, within a specified distance from (or coincident with) a subset of the pixels that defines an outer perimeter of another shape, coincident with an area that is defined by another shape, etc. If the second location is within the third specified proximity to other shape(s) in the workspace, flow continues to step 524. Otherwise, flow continues to step 528. In an example implementation, proximity logic 708 determines whether the second location is within the third specified proximity to other shape(s) in the workspace.

At step 524, a designated shape of the other shape(s) is determined for which a distance between the designated shape and the second location is not greater than a distance between each of the other shape(s) and the second location. In an example implementation, distance logic 712 determines the designated shape of the other shape(s).

At step 526, a connection is provided between the first shape and the designated shape. In an example implementation, connection logic 710 provides a connection between the first shape and the designated shape. Upon completion of step 526, flowchart 500 ends.

At step 528, a third shape is created in the workspace at a designated location that corresponds to the second location. In an example implementation, shape logic 704 creates the third shape in the workspace at the designated location.

In an example embodiment, a determination is made that creation of the third shape at the second location would result in the third shape overlapping with at least one of the other shape(s) in the workspace. For instance, overlap logic 714 may determine that creation of the third shape at the second location would result in the third shape overlapping with at least one of the other shape(s) in the workspace. In accordance with this embodiment, creating the third shape at the designated location is performed such that the third shape does not overlap with at least one of the other shape(s) in the workspace. In an aspect of this embodiment, creating the third shape may include automatically changing a location at which the third shape is to be created form the second location to the designated location.

At step 530, a connection is provided between the first shape and the third shape. In an example implementation, connection logic 710 provides a connection between the first shape and the third shape. Upon completion of step 530, flowchart 500 ends.

In an example embodiment, a determination is made that the first shape has a designated shape type. For instance, type logic 716 may determine that the first shape has the designated shape type. In accordance with this embodiment, the designated shape type is selected from a plurality of shape types for the third shape based on the first shape having the designated shape type. For instance, type logic may select the designated shape type from the plurality of shape types for the third shape. In further accordance with this embodiment, the third shape is created at step 528 to have the designated shape type. It will be recognized that the designated shape type of the third shape may be subsequently changed to another shape type. For example, a type change instruction may be received from a user. In accordance with this example, the designated shape type of the third shape may be replaced with a different shape type that is specified by the type change instruction.

In another example embodiment, a menu is provided that identifies a plurality of selectable shape types in response to determining that the release action is initiated at step 516. For instance, menu logic 718 may provide the menu (e.g., in a pop-up window) in response to determining that the release action is initiated. In accordance with this embodiment, a determination may be made that a designated selectable shape type of the plurality of selectable shape types is selected. For instance, menu logic 718 may determine that the designated selectable shape type is selected. In further accordance with this embodiment, the third shape is created at step 528 to have the designated selectable shape type in response to a determination that the designated selectable shape type is selected.

In yet another example embodiment, a plurality of potential routes is available for a specified connection. The specified connection may be any suitable connection. For example, the specified connection may be the connection between the first pixel and the second pixel, as described above with reference to step 520. In another example, the specified connection may be the connection between the first shape and the designated shape, as described above with reference to step 526. In yet another example, the specified connection may be the connection between the first shape and the third shape, as described above with reference to step 530. In an aspect of this embodiment, other route(s) may be included in the workspace. The other route(s) may be associated with respective connection(s) that exist between shapes in the workspace. A designated potential route of the plurality of potential routes does not overlap with the other route(s) and/or with any shapes in the workspace. For instance, route logic 720 may determine that the designated potential route does not overlap with the other route(s) and/or with any of the shapes in the workspace. At least one potential route of the plurality of potential routes overlaps with at least one of the other route(s) and/or with at least one of the shapes in the workspace. For instance, a first potential route of the plurality of potential routes may overlap with at least one of the other route(s) and not overlap with at least one of the shapes in the workspace. A second potential route of the plurality of routes may overlap with at least one of the shapes in the workspace and not overlap with at least one of the other route(s). A third potential route of the plurality of routes may overlap with at least one of the other route(s) and overlap with at least one of the shapes in the workspace. In further accordance with this embodiment, the designated potential route is automatically selected for the specified connection from the plurality of potential routes based on the designated potential route not overlapping with the other route(s) and/or based on the designated potential route not overlapping with at least one of the shapes in the workspace. For instance, route logic 720 may automatically select the designated potential route for the specified connection. In further accordance with this embodiment, the specified connection is provided in accordance with the designated potential route. For instance, the specified connection may be provided to have the designated potential route.

It should be noted that route logic 720 initially may attempt to avoid overlapping the specified connection with the other route(s) and with any of the shapes in the workspace. If all of the potential routes in the plurality of potential routes overlap at least one of the other route(s), route logic 720 may stop attempting to avoid overlapping the specified connection with the other route(s), though route logic 720 may continue attempting to avoid overlapping the specified connection with any of the shapes in the workspace. If all of the potential routes in the plurality of potential routes overlap at least one of the shapes in the workspace, route logic 720 may stop attempting to avoid overlapping the specified connection with any of the shapes in the workspace. If route logic 720 determines that all of the potential routes in the plurality of routes overlap at least one of the other route(s) and at least one of the shapes in the workspace, route logic 720 may select (e.g., automatically select) a specified potential route from the plurality of potential routes for the specified connection. For instance, the specified potential route may be selected based on the specified potential route overlapping no more (e.g., fewer) other route(s) and/or no more (e.g., fewer) of the shapes in the workspace than other potential routes in the plurality of potential routes.

In still another example embodiment, a determination is made that a second selection action is initiated while the cursor is located at a third location that is within a designated proximity to a specified connection. For instance, action logic 706 may determine that the second selection action is initiated while the cursor is located at the third location. The second selection action may be any suitable action, including but not limited to a single-click or a double-click using a pointing device (e.g., a mouse, finger, or stylus), maintaining the cursor at the third location for at least a specified period of time, a spoken selection command, etc. In accordance with this embodiment, a menu is provided that identifies a plurality of selectable properties of the specified connection. For instance, menu logic 718 may provide the menu. Each of the selectable properties is selectable to change a value of that selectable property. In response to selection of a selectable property in the menu, a second menu that includes a plurality of selectable values of that selectable property may be provided, or a text window may be provided for entry of a suitable value.

In some example embodiments, one or more steps 502, 504, 506, 508, 510, 512, 514, 516, 518, 520, 522, 524, 526, 528, and/or 530 of flowchart 500 may not be performed. Moreover, steps in addition to or in lieu of steps 502, 504, 506, 508, 510, 512, 514, 516, 518, 520, 522, 524, 526, 528, and/or 530 may be performed.

As shown in FIG. 6, the method of flowchart 600 begins at step 602. In step 602, information regarding a visual representation of a workspace is provided toward a user interface. The visual representation is defined by pixels. In an example implementation, workspace logic 702 provides the information regarding the visual representation of the workspace toward the user interface.

At step 604, a first shape is provided in the workspace. The first shape has an outer perimeter that is defined by a first subset of the pixels. The first subset includes a series of adjacent pixels for each side of the first shape. Each pixel in the first subset is selectable as a first connection point. In an example implementation, shape logic 704 provides the first shape in the workspace.

At step 606, a second shape is provided in the workspace. The second shape has an outer perimeter that is defined by a second subset of the pixels. The second subset includes a series of adjacent pixels for each side of the second shape. Each pixel in the second subset is selectable as a second connection point. In an example implementation, shape logic 704 provides the second shape in the workspace.

At step 608, a determination is made that a selection action is initiated while a cursor is located at a first location within a specified proximity to the first shape in the workspace. In an example implementation, action logic 706 determines that the selection action is initiated while the cursor is located at the first location.

At step 610, a determination is made that a release action is initiated while the cursor is located at a second location in the workspace. In an example implementation, action logic 706 determines that the release action is initiated while the cursor is located at the second location.

In some example embodiments, step 610 is performed in response to step 606. For example, the second location may be within a second specified proximity to the second shape. In accordance with this example, it may be determined at step 610 that the release action is initiated while the cursor is located at the second location within the second specified proximity to the second shape.

In other example embodiments, step 606 is performed in response to step 610. In accordance with these embodiments, the second location may not be within a second specified proximity to the first shape and/or other shape(s) in the workspace. Accordingly, it may be determined at step 610 that the release action is initiated while the cursor is located at the second location not within the second specified proximity to the first shape and/or the other shape(s).

In an aspect of these embodiments, a menu may be provided that identifies a plurality of selectable shape types in response to determining that the release action is initiated at step 610. In accordance with this aspect, a determination may be made that a designated selectable shape type of the plurality of selectable shape types is selected. In further accordance with this aspect, the second shape may be provided at step 606 to have the designated selectable shape type in response to determining that the designated selectable shape type is selected.

In another aspect, a determination may be made that the first shape has a designated shape type. In accordance with this aspect, the designated shape type may be selected from a plurality of shape types for the second shape based on the first shape having the designated shape type. In further accordance with this aspect, the second shape may be provided at step 606 to have the designated shape type in response to selecting the designated shape type for the second shape.

In yet another aspect, a determination may be made that providing the second shape at the second location would result in the second shape overlapping with at least one of the other shape(s) (e.g., the first shape) in the workspace. In accordance with this aspect, the second shape may be provided at step 606 such that the second shape does not overlap with at least one of the other shape(s) in the workspace.

At step 612, a first pixel of the first subset of pixels is selected to be the first connection point based on one or more first criteria. For instance, the one or more first criteria may specify that the first pixel is to be within a first proximity to the first location, that the first pixel is to be a pixel in the series of pixels for a designated side of the first shape that is closer to the first location than other pixels in the series of pixels for the designated side, that selection of the first pixel is to result in a connection thereto not overlapping with another connection in the workspace, etc. In an example implementation, pixel selection logic 722 selects the first pixel of the first subset of pixels to be the first connection point based on the one or more criteria.

At step 614, a second pixel of the second subset of pixels is selected to be the second connection point based on one or more second criteria. For instance, the one or more second criteria may specify that the second pixel is to be within a second proximity to the second location, that the second pixel is to be a pixel in the series of pixels for a designated side of the second shape that is closer to the second location than other pixels in the series of pixels for the designated side, that selection of the second pixel is to result in a connection thereto not overlapping with another connection in the workspace, that selection of the second pixel is to result in the second shape not overlapping with another one or more shapes in the workspace, etc. In an example implementation, pixel selection logic 722 selects the second pixel of the second subset of the pixels to be the second connection point based on the one or more criteria.

At step 616, a connection is provided between the first connection point and the second connection point. In an example implementation, connection logic 710 provides the connection between the first connection point and the second connection point.

In some example embodiments, one or more steps 602, 604, 606, 608, 610, 612, 614, and/or 616 of flowchart 600 may not be performed. Moreover, steps in addition to or in lieu of steps 602, 604, 606, 608, 610, 612, 614, and/or 616 may be performed.

It will be recognized that unrestricted connection logic 700 may not include one or more of workspace logic 702, shape logic 704, action logic 706, proximity determination logic 708, connection logic 710, distance logic 712, overlap logic 714, type logic 716, menu logic 718, route logic 720, and/or pixel selection logic 722. Furthermore, unrestricted connection logic 700 may include modules in addition to or in lieu of workspace logic 702, shape logic 704, action logic 706, proximity determination logic 708, connection logic 710, distance logic 712, overlap logic 714, type logic 716, menu logic 718, route logic 720, and/or pixel selection logic 722.

Graphic flow module 108, unrestricted connection logic 110, workspace logic 702, shape logic 704, action logic 706, proximity determination logic 708, connection logic 710, distance logic 712, overlap logic 714, type logic 716, menu logic 718, route logic 720, pixel selection logic 722, flowchart 500, and flowchart 600 may be implemented in hardware, software, firmware, or any combination thereof.

For example, graphic flow module 108, unrestricted connection logic 110, workspace logic 702, shape logic 704, action logic 706, proximity determination logic 708, connection logic 710, distance logic 712, overlap logic 714, type logic 716, menu logic 718, route logic 720, pixel selection logic 722, flowchart 500, and/or flowchart 600 may be implemented as computer program code configured to be executed in one or more processors.

In another example, graphic flow module 108, unrestricted connection logic 110, workspace logic 702, shape logic 704, action logic 706, proximity determination logic 708, connection logic 710, distance logic 712, overlap logic 714, type logic 716, menu logic 718, route logic 720, pixel selection logic 722, flowchart 500, and/or flowchart 600 may be implemented as hardware logic/electrical circuitry. For instance, in an embodiment, one or more of graphic flow module 108, unrestricted connection logic 110, workspace logic 702, shape logic 704, action logic 706, proximity determination logic 708, connection logic 710, distance logic 712, overlap logic 714, type logic 716, menu logic 718, route logic 720, pixel selection logic 722, flowchart 500, and/or flowchart 600 may be implemented in a system-on-chip (SoC). The SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

Figure 8:
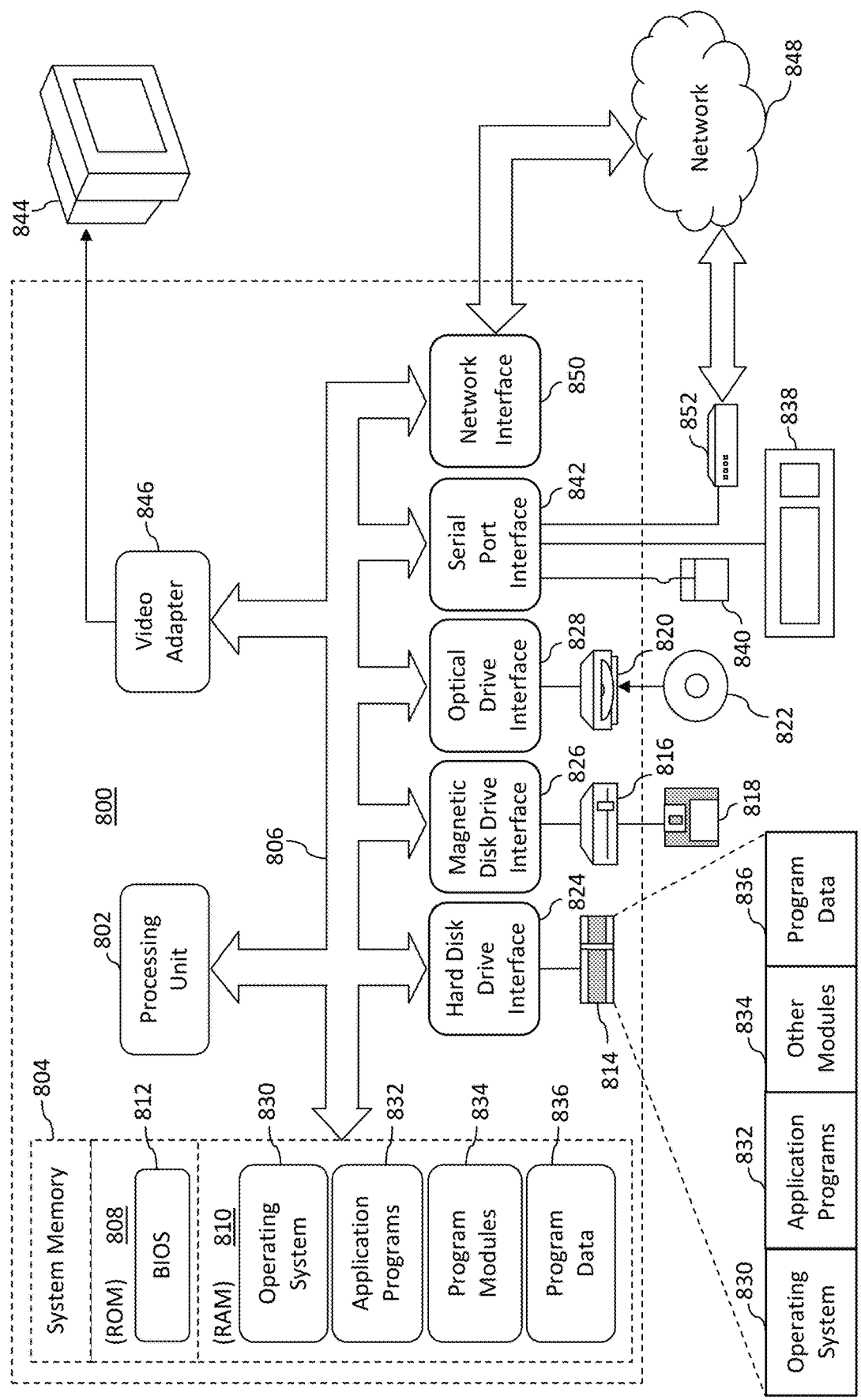
FIG. 8 depicts an example computer in which embodiments may be implemented.

FIG. 8 depicts an example computer 800 in which embodiments may be implemented. Any one or more of the clients 102A-102M or any one or more of servers 106A-106N shown in FIG. 1 (or any one or more subcomponents thereof shown in FIGS. 1 and 7) may be implemented using computer 800, including one or more features of computer 800 and/or alternative features. Computer 800 may be a general-purpose computing device in the form of a conventional personal computer, a mobile computer, or a workstation, for example, or computer 800 may be a special purpose computing device. The description of computer 800 provided herein is provided for purposes of illustration, and is not intended to be limiting. Embodiments may be implemented in further types of computer systems, as would be known to persons skilled in the relevant art(s).

As shown in FIG. 8, computer 800 includes a processing unit 802, a system memory 804, and a bus 806 that couples various system components including system memory 804 to processing unit 802. Bus 806 represents one or more of any of several types of bus structures, including a memory bus or memory controller, a peripheral bus, an accelerated graphics port, and a processor or local bus using any of a variety of bus architectures. System memory 804 includes read only memory (ROM) 808 and random access memory (RAM) 810. A basic input/output system 812 (BIOS) is stored in ROM 808.

Computer 800 also has one or more of the following drives: a hard disk drive 814 for reading from and writing to a hard disk, a magnetic disk drive 816 for reading from or writing to a removable magnetic disk 818, and an optical disk drive 820 for reading from or writing to a removable optical disk 822 such as a CD ROM, DVD ROM, or other optical media. Hard disk drive 814, magnetic disk drive 816, and optical disk drive 820 are connected to bus 806 by a hard disk drive interface 824, a magnetic disk drive interface 826, and an optical drive interface 828, respectively. The drives and their associated computer-readable storage media provide nonvolatile storage of computer-readable instructions, data structures, program modules and other data for the computer. Although a hard disk, a removable magnetic disk and a removable optical disk are described, other types of computer-readable storage media can be used to store data, such as flash memory cards, digital video disks, random access memories (RAMs), read only memories (ROM), and the like.

A number of program modules may be stored on the hard disk, magnetic disk, optical disk, ROM, or RAM. These programs include an operating system 830, one or more application programs 832, other program modules 834, and program data 836. Application programs 832 or program modules 834 may include, for example, computer program logic for implementing graphic flow module 108, unrestricted connection logic 110, workspace logic 702, shape logic 704, action logic 706, proximity determination logic 708, connection logic 710, distance logic 712, overlap logic 714, type logic 716, menu logic 718, route logic 720, pixel selection logic 722, flowchart 500 (including any step of flowchart 500), and/or flowchart 600 (including any step of flowchart 600), as described herein.

A user may enter commands and information into the computer 800 through input devices such as keyboard 838 and pointing device 840. Other input devices (not shown) may include a microphone, joystick, game pad, satellite dish, scanner, or the like. These and other input devices are often connected to the processing unit 802 through a serial port interface 842 that is coupled to bus 806, but may be connected by other interfaces, such as a parallel port, game port, or a universal serial bus (USB).

A display device 844 (e.g., a monitor) is also connected to bus 806 via an interface, such as a video adapter 846. In addition to display device 844, computer 800 may include other peripheral output devices (not shown) such as speakers and printers.

Computer 800 is connected to a network 848 (e.g., the Internet) through a network interface or adapter 850, a modem 852, or other means for establishing communications over the network. Modem 852, which may be internal or external, is connected to bus 806 via serial port interface 842.

As used herein, the terms "computer program medium" and "computer-readable medium" are used to generally refer to media such as the hard disk associated with hard disk drive 814, removable magnetic disk 818, removable optical disk 822, as well as other media such as flash memory cards, digital video disks, random access memories (RAMs), read only memories (ROM), and the like. Such computer-readable storage media are distinguished from and non-overlapping with communication media. Communication media typically embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media. Example embodiments are also directed to such communication media.

As noted above, computer programs and modules (including application programs 832 and other program modules 834) may be stored on the hard disk, magnetic disk, optical disk, ROM, or RAM. Such computer programs may also be received via network interface 850 or serial port interface 842. Such computer programs, when executed or loaded by an application, enable computer 800 to implement features of embodiments discussed herein. Accordingly, such computer programs represent controllers of the computer 800.

Example embodiments are also directed to computer program products comprising software (e.g., computer-readable instructions) stored on any computer useable medium. Such software, when executed in one or more data processing devices, causes a data processing device(s) to operate as described herein. Embodiments may employ any computer-useable or computer-readable medium, known now or in the future. Examples of computer-readable mediums include, but are not limited to storage devices such as RAM, hard drives, floppy disks, CD ROMs, DVD ROMs, zip disks, tapes, magnetic storage devices, optical storage devices, MEMS-based storage devices, nanotechnology-based storage devices, and the like.

III. Conclusion

While various embodiments have been described above, it should be understood that they have been presented by way of example only, and not limitation. It will be apparent to persons skilled in the relevant art(s) that various changes in form and details can be made therein without departing from the spirit and scope of the invention. Thus, the breadth and scope of the present invention should not be limited by any of the above-described example embodiments, but should be defined only in accordance with the following claims and their equivalents.

What is claimed is:

1. A system comprising:
    memory; and
    one or more processors coupled to the memory, the one or more processors configured to:
        provide information regarding a visual representation of a workspace toward a user interface, the visual representation being defined by a plurality of pixels;
        provide a first shape and a second shape in the workspace,
            the first shape having an outer perimeter that is defined by a first subset of the plurality of pixels, each pixel in the first subset being selectable as a first connection point,
            the second shape having an outer perimeter that is defined by a second subset of the plurality of pixels, each pixel in the second subset being selectable as a second connection point;
        determine that a selection action is initiated while a cursor is located at a first location in the workspace;
        determine that a release action is initiated while the cursor is located at a second location in the workspace in response to a determination that the selection action is initiated;
        select a first pixel of the first subset of the plurality of pixels that is proximate the first location to be the first connection point in response to a determination that the selection action is initiated while the cursor is located at the first location in the workspace;
        select a second pixel of the second subset of the plurality of pixels that is proximate the second location to be the second connection point in response to a determination that the release action is initiated while the cursor is located at the second location in the workspace;
        automatically select a potential route for a connection between the first pixel, which is at a first specified position in the workspace and which is included in the first subset of the plurality of pixels that defines the outer perimeter of the first shape, and the second pixel, which is at a second specified position in the workspace and which is included in the second subset of the plurality of pixels that defines the outer perimeter of the second shape, from a plurality of potential routes based at least in part on the selected potential route not overlapping with one or more other connections that are included in the workspace, the connection connected to no shapes other than the first shape and the second shape,
            at least one potential route of the plurality of potential routes overlaps with at least one of the one or more other connections that are included in the workspace,
            the selected potential route does not overlap with one or more other connections between shapes that are included in the workspace; and
        provide the connection between the first connection point and the second connection point in accordance with the selected potential route.

2. The system of claim 1, wherein the first subset of the plurality of pixels includes a series of adjacent pixels for each side of the first shape;
    wherein the second subset includes a series of adjacent pixels for each side of the second shape; and
    wherein the one or more processors are configured to:
        select the first pixel of the first subset of the plurality of pixels that is proximate the first location from among the series of pixels for a first designated side of the first shape to be the first connection point in response to the determination that the selection action is initiated while the cursor is located at the first location in the workspace; and
        select the second pixel of the second subset of the plurality of pixels that is proximate the second location from among the series of pixels for the second designated side of the second shape to be the second connection point in response to the determination that the release action is initiated while the cursor is located at the second location in the workspace.

3. The system of claim 1, wherein the one or more processors are configured to:
    determine that the first location is within a specified distance from an area that is defined by the first shape; and
    select the first pixel of the first subset of the plurality of pixels that is proximate the first location to be the first connection point based at least in part on the determination that the selection action is initiated while the cursor is located at the first location in the workspace and further based at least in part on a determination that the first location is within the specified distance from the area that is defined by the first shape.

4. The system of claim 3, wherein the one or more processors are configured to:
determine that the second location is within a second specified distance from a second area that is defined by the second shape; and
select the second pixel of the second subset of the plurality of pixels that is proximate the second location to be the second connection point based at least in part on the determination that the release action is initiated while the cursor is located at the second location in the workspace and further based at least in part on a determination that the second location is within the second specified distance from the second area that is defined by the second shape.

5. The system of claim 1, wherein the one or more processors are configured to:
determine that the first shape has a designated shape type;
select the designated shape type from a plurality of shape types for the second shape based at least in part on the first shape having the designated shape type; and
provide the second shape to have the designated shape type in response to selection of the designated shape type for the second shape.

6. The system of claim 1, wherein the one or more processors are configured to:
determine that a second selection action is initiated while the cursor is located at a third location that is within a designated proximity to the connection between the first pixel, which is included in the first subset of the plurality of pixels that defines the outer perimeter of the first shape, and the second pixel, which is included in the second subset of the plurality of pixels that defines the outer perimeter of the second shape;
provide a menu that identifies a plurality of selectable properties of the connection between the first pixel and the second pixel in response to a determination that the second selection action is initiated, each selectable property of the plurality of selectable properties being selectable to change a value of that selectable property; and
provide a second menu for at least one of selection or entry of the value of a designated selectable property of the connection between the first pixel and the second pixel based at least in part on the designated selectable property of the connection between the first pixel and the second pixel being selected from the plurality of selectable properties.

7. The system of claim 1, wherein the one or more processors are configured to:
provide a textual hint based at least in part on the cursor being within a specified proximity to the first shape, the textual hint providing information regarding an action that is capable of being performed based at least in part on the cursor being proximate the first shape, the textual hint specifying that a connection is capable of being created by dragging a line out from the first pixel.

8. A method comprising:
providing information regarding a visual representation of a workspace toward a user interface, the visual representation being defined by a plurality of pixels;
providing a first shape in the workspace, the first shape having an outer perimeter that is defined by a first subset of the plurality of pixels;
determining that a selection action is initiated while a cursor is located at a first location in the workspace;
determining a first pixel of the first subset of the plurality of pixels that is proximate the first location;
determining that a release action is initiated while the cursor is located at a second location in the workspace;
automatically selecting a designated potential route for a connection between the first pixel, which is at a first specified position in the workspace and which is included in the first subset of the plurality of pixels that defines the outer perimeter of the first shape, and a second pixel, which is at a second specified position in the workspace and which is included in a second subset of the plurality of pixels that defines an outer boundary of a second shape, from a plurality of potential routes based at least in part on the designated potential route not overlapping with one or more other connections that are included in the workspace,
the connection connected to no shapes other than the first shape and the second shape,
at least one potential route of the plurality of potential routes overlaps with at least one of the one or more other connections that are included in the workspace; and
providing a connection between the first pixel and the second pixel in accordance with the designated potential route.

9. The method of claim 8, wherein determining that the release action is initiated comprises:
determining that the release action is initiated while the cursor is located at the second location in the workspace and while the second location does not correspond to an existing shape in the workspace.

10. The method of claim 8, further comprising:
determining that the second location is not within a second specified distance from one or more areas that are defined by one or more respective other shapes in the workspace; and
creating the second shape in the workspace at a designated location that corresponds to the second location based at least in part on the second location not being within the second specified distance from the one or more areas that are defined by the one or more respective other shapes in the workspace.

11. The method of claim 8, further comprising:
determining that the first shape has a designated shape type; and
selecting the designated shape type from a plurality of shape types for the second shape based at least in part on the first shape having the designated shape type;
wherein creating the second shape comprises:
creating the second shape to have the designated shape type in response to selecting the designated shape type for the second shape.

12. The method of claim 8, further comprising:
determining that a second selection action is initiated while the cursor is located at a third location that is within a designated proximity to the connection between the first pixel, which is included in the first subset of the plurality of pixels that defines the outer perimeter of the first shape, and the second pixel, which is included in the second subset of the plurality of pixels that defines the outer boundary of the second shape;
providing a menu that identifies a plurality of selectable properties of the connection between the first pixel and the second pixel in response to determining that the second selection action is initiated, each selectable property of the plurality of selectable properties being selectable to change a value of that selectable property;
determining that a designated selectable property of the connection between the first pixel and the second pixel is selected from the plurality of selectable properties; and
providing a second menu for at least one of selection or entry of the value of the designated selectable property of the connection between the first pixel and the second pixel in response to determining that the designated selectable property of the connection between the first pixel and the second pixel is selected.

13. The method of claim 8, further comprising:
determining that each of a plurality of potential routes for the connection overlaps with at least one other connection that is included in the workspace; and
selecting a specified potential route from the plurality of potential routes for the connection based at least in part on the specified potential route overlapping no more other connections in the workspace than other potential routes in the plurality of potential routes.

14. The method of claim 8, further comprising:
providing a textual hint based at least in part on the cursor being within a specified proximity to the first shape, the textual hint providing information regarding an action that is capable of being performed based at least in part on the cursor being proximate the first shape;
wherein the textual hint specifies that a connection is capable of being created by dragging a line out from the first pixel.

15. A method comprising:
providing information regarding a visual representation of a workspace toward a user interface, the visual representation being defined by a plurality of pixels;
providing a first shape and a second shape in the workspace,
the first shape having an outer perimeter that is defined by a first subset of the plurality of pixels, each pixel in the first subset being selectable as a first connection point,
the second shape having an outer perimeter that is defined by a second subset of the plurality of pixels, each pixel in the second subset being selectable as a second connection point;
determining that a selection action is initiated while a cursor is located at a first location in the workspace;
determining that a release action is initiated while the cursor is located at a second location in the workspace in response to determining that the selection action is initiated;
selecting a first pixel of the first subset of the plurality of pixels that is proximate the first location to be the first connection point in response to determining that the selection action is initiated while the cursor is located at the first location in the workspace;
selecting a second pixel of the second subset of the plurality of pixels that is proximate the second location to be the second connection point in response to determining that the release action is initiated while the cursor is located at the second location in the workspace;
automatically selecting a potential route for a connection between the first pixel, which is at a first specified position in the workspace and which is included in the first subset of the plurality of pixels that defines the outer perimeter of the first shape, and the second pixel, which is at a second specified position in the workspace and which is included in the second subset of the plurality of pixels that defines the outer perimeter of the second shape, from a plurality of potential routes based at least in part on the selected potential route not overlapping with one or more other connections that are included in the workspace,
the connection connected to no shapes other than the first shape and the second shape,
at least one potential route of the plurality of potential routes overlaps with at least one of the one or more other connections that are included in the workspace,
the selected potential route does not overlap with one or more other connections between shapes that are included in the workspace; and
providing the connection between the first connection point and the second connection point in accordance with the selected potential route.

16. The method of claim 15, wherein the first subset of the plurality of pixels includes a series of adjacent pixels for each side of the first shape;
wherein the second subset includes a series of adjacent pixels for each side of the second shape;
wherein selecting the first pixel of the first subset of the plurality of pixels that is proximate the first location to be the first connection point comprises:
selecting the first pixel of the first subset of the plurality of pixels that is proximate the first location from among the series of pixels for a first designated side of the first shape to be the first connection point in response to the determination that the selection action is initiated while the cursor is located at the first location in the workspace; and
wherein selecting the second pixel of the second subset of the plurality of pixels that is proximate the second location to be the second connection point comprises:
selecting the second pixel of the second subset of the plurality of pixels that is proximate the second location from among the series of pixels for the second designated side of the second shape to be the second connection point in response to the determination that the release action is initiated while the cursor is located at the second location in the workspace.

17. The method of claim 15, further comprising:
determining that the first shape has a designated shape type; and
selecting the designated shape type from a plurality of shape types for the second shape based at least in part on the first shape having the designated shape type;
wherein providing the first shape and the second shape in the workspace comprises:
providing the second shape to have the designated shape type in response to selection of the designated shape type for the second shape.

18. The method of claim 15, wherein the one or more processors are configured to:
determine that a second selection action is initiated while the cursor is located at a third location that is within a designated proximity to the connection between the first pixel, which is included in the first subset of the plurality of pixels that defines the outer perimeter of the first shape, and the second pixel, which is included in the second subset of the plurality of pixels that defines the outer perimeter of the second shape;
provide a menu that identifies a plurality of selectable properties of the connection between the first pixel and the second pixel in response to a determination that the second selection action is initiated, each selectable property of the plurality of selectable properties being selectable to change a value of that selectable property; and provide a second menu for at least one of selection or entry of the value of a designated selectable property of the connection between the first pixel and the second pixel based at least in part on the designated selectable property of the connection between the first pixel and the second pixel being selected from the plurality of selectable properties.

19. The method of claim 15, further comprising:

providing a textual hint based at least in part on the cursor being within a specified proximity to the first shape, the textual hint providing information regarding an action that is capable of being performed based at least in part on the cursor being proximate the first shape.

20. The method of claim 19, wherein the textual hint specifies that a connection is capable of being created by dragging a line out from the first pixel.

* * * * *